US007928728B2

(12) United States Patent
Wedeen

(10) Patent No.: US 7,928,728 B2
(45) Date of Patent: Apr. 19, 2011

(54) VISUALIZING HIGH-RESOLUTION DIFFUSION DATA BY MAXIMUM COHERENCE PROJECTION

(75) Inventor: Van J. Wedeen, Sommerville, MA (US)

(73) Assignee: the General Hospital Corporation, Boston, MA (US)

(*) Notice: Subject to any disclaimer, the term of this patent is extended or adjusted under 35 U.S.C. 154(b) by 624 days.

(21) Appl. No.: 11/816,805

(22) PCT Filed: Mar. 10, 2006

(86) PCT No.: PCT/US2006/008665
§ 371 (c)(1),
(2), (4) Date: May 19, 2008

(87) PCT Pub. No.: WO2006/099179
PCT Pub. Date: Sep. 21, 2006

(65) Prior Publication Data
US 2008/0284434 A1    Nov. 20, 2008

Related U.S. Application Data

(60) Provisional application No. 60/660,566, filed on Mar. 11, 2005, provisional application No. 60/660,565, filed on Mar. 11, 2005.

(51) Int. Cl.
*G01V 3/00*    (2006.01)

(52) U.S. Cl. ........................................ 324/309; 324/307
(58) Field of Classification Search .......... 324/300–322; 600/407–445; 702/19
See application file for complete search history.

(56) References Cited

U.S. PATENT DOCUMENTS

| | | | |
|---|---|---|---|
| 6,614,226 B2 * | 9/2003 | Wedeen | 324/309 |
| 7,268,551 B2 * | 9/2007 | Lange | 324/318 |
| 7,355,403 B2 * | 4/2008 | Chakraborty | 324/307 |
| 7,358,730 B2 * | 4/2008 | Mistretta et al. | 324/307 |
| 7,495,440 B2 * | 2/2009 | Chiang et al. | 324/309 |
| 7,511,494 B2 * | 3/2009 | Wedeen | 324/309 |
| 7,570,049 B2 * | 8/2009 | Lange | 324/307 |
| 7,657,071 B2 * | 2/2010 | Bartesaghi et al. | 382/128 |
| 7,683,616 B2 * | 3/2010 | Kabasawa | 324/309 |
| 2002/0042569 A1 | 4/2002 | Wedeen | |
| 2009/0037108 A1 * | 2/2009 | Wedeen | 702/1 |
| 2010/0004527 A1 * | 1/2010 | Dale et al. | 600/410 |

* cited by examiner

*Primary Examiner* — Brij B Shrivastav
(74) *Attorney, Agent, or Firm* — Quarles & Brady LLP

(57) ABSTRACT

A method for displaying diffusion data includes defining intra-voxel coherence and inter-voxel coherence of the diffusion data. On the basis of the inter-voxel coherence and the intra-voxel coherence, a multiplicity of tracks can be defined. Only those tracks having a selected characteristic are displayed.

42 Claims, 10 Drawing Sheets
(8 of 10 Drawing Sheet(s) Filed in Color)

US 7,928,728 B2

VISUALIZING HIGH-RESOLUTION DIFFUSION DATA BY MAXIMUM COHERENCE PROJECTION

RELATED APPLICATION

This application is the U.S. national stage, under 35 USC 371, of International Application No. PCT/US2006/008665, filed Mar. 10, 2006, which claims the benefit of the priorty date of U.S. Provisional Application Nos. 60/660,566, and 60/660,565, both filed Mar. 11, 2005. The contents of these applications are incorporated herein by reference.

STATEMENT OF FEDERALLY SPONSORED RESEARCH

The invention was made with Government support under Grant R01 MH64044 awarded by the National Institute of Health. The Federal Government may have certain rights in the invention.

FIELD OF INVENTION

The invention relates to tractography, and in particular, to the identification and display of tracks from diffusion data.

BACKGROUND

The brain includes gray matter connected by channels of nerve fiber, which is often white matter and sometimes referred to as the fasciculi. A purpose of tractography is to identify the paths, or tracks, followed by the nerve fiber and to use those tracks to form a map of a standard brain. By inspecting the resulting map, one might elucidate certain patterns and structures that may shed light on how the brain carries out its functions.

A physiological characteristic of the nerve fiber tracks is that water will tend to diffuse along the direction of those tracks and will tend to encounter resistance in attempting to diffuse transverse to the tracks. Thus, by observing the directions in which water diffuses at different locations in the brain, one can identify the directions of major fiber bundles within the brain tissue. If one could identify a preferred direction of diffusion, one would be able to determine the directions of the fiber bundles in that tissue.

A known way to collect data indicative of the diffusion of water in the brain is to obtain MRI images of the brain. One approach to doing so, known as "diffusion tensor MRI," involves estimating a diffusion tensor at each voxel in the brain. Other approaches include representing the diffusion characteristic at each voxel with a orientation density function defined over a sphere or over another volume. Yet another approach is to represent the diffusion characteristic at each voxel. FIG. 1 provides a comparison between tractographic data from a structure as obtained using DSI and tractographic data from the same structure as obtained using the q-ball method.

In much of the brain, and in particular, throughout the cerebral cortex, these tracks tend to cross repeatedly. Thus, if one could accurately display every track, the resulting display would look much like a ball of steel wool, with millions of individual tracks that cross and re-cross each other to form an apparently seamless and featureless whole. Such a display would be difficult to interpret.

SUMMARY

The invention is based on the recognition that one can use coherences in the diffusion data to build the tracks themselves.

In one aspect, the invention features a method for displaying diffusion data in which an orientation density function associated with a first voxel is obtained. The first voxel, which lies on at least one track, includes a first orientation vector. A second voxel is then identified on the basis of the first orientation vector. Then, a second orientation vector is selected from a set of orientation vectors associated with the second voxel. On the basis of a relationship between the first and second orientation vectors, one determines whether a section of track is to be built along the path defined by the first and second orientation vectors.

In another aspect, the invention is based on the recognition that tractographic data is more readily understood when only those portions of the data that have specified characteristics are actually displayed.

In this aspect, the invention features a method for displaying diffusion data. This is achieved by defining an intra-voxel coherence and an inter-voxel coherence of the diffusion data. On the basis of the inter-voxel coherence and the intra-voxel coherence, a multiplicity of tracks can be defined. Then, only those tracks having a selected characteristic are displayed.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and the accompanying figures, in which:

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

In displaying nerve fiber tracks, there exists a tension between overwhelming the viewer by displaying too much data and displaying a paucity of data from which the viewer can learn little of significance. Generally, one must display enough to provide some context between what is displayed and other structures so that the significance of the anatomic position and density of tracks can be readily appreciated.

The method disclosed herein provides a way to exploit underlying coherences in diffusion data to provide a display. There are two types of coherence that are used. One type of coherence is that which indicates the various directions, represented by orientation vectors, at which local maxima of diffusion occur at a particular voxel.

This coherence, which will be referred to as "intra-voxel coherence," suggests the number of nerve fiber tracks that pass through a voxel and the directions in which they proceed. A second type of coherence is that which indicates how closely aligned the orientation vectors of adjacent voxels are. This coherence, which is referred to as "inter-voxel coherence," provides a basis for determining whether a nerve fiber track extends between two adjacent voxels.

Figure 1:
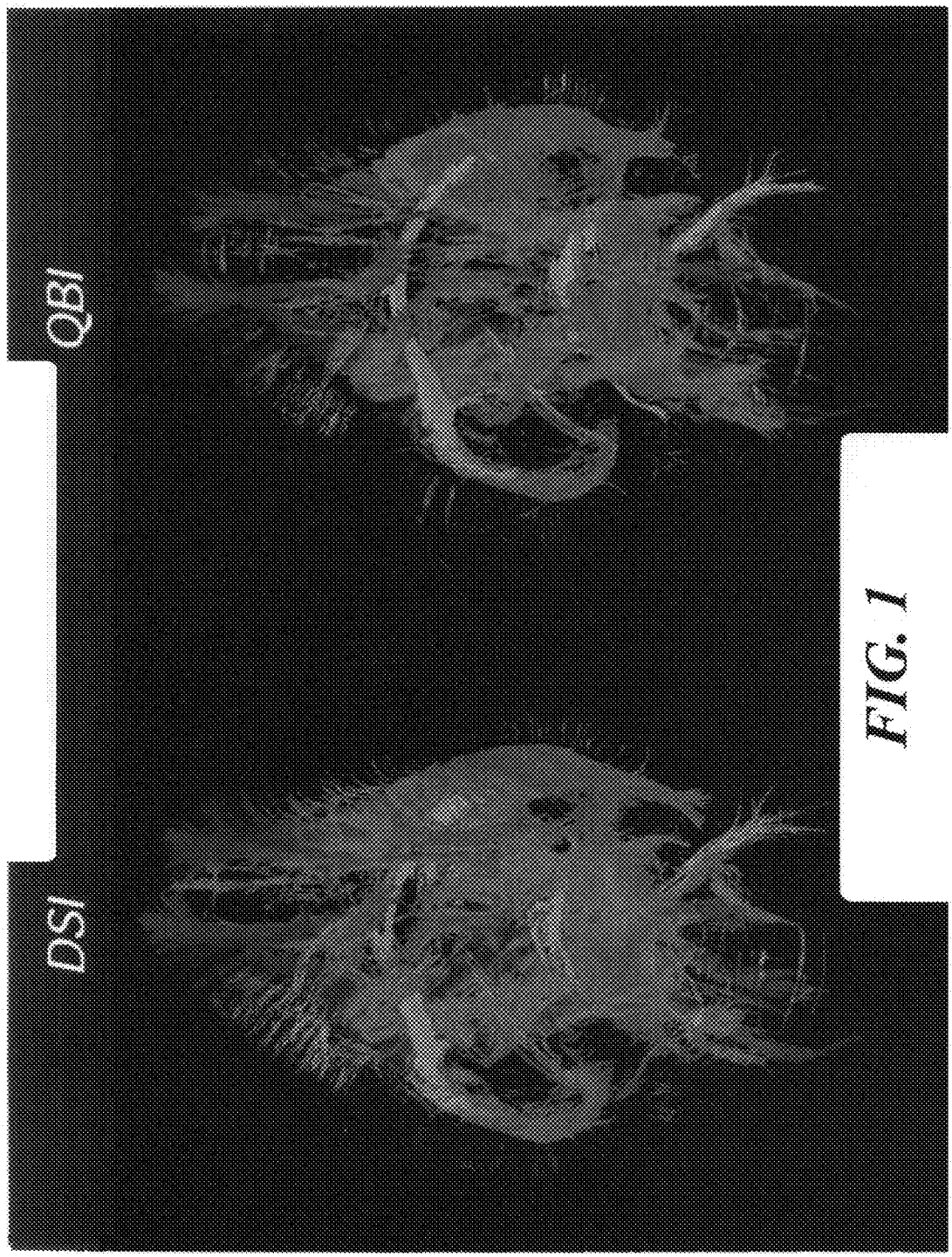
FIG. 1 is a comparison of tracks obtained from diffusion data by q-ball MRI and DSI.
Figure 2:
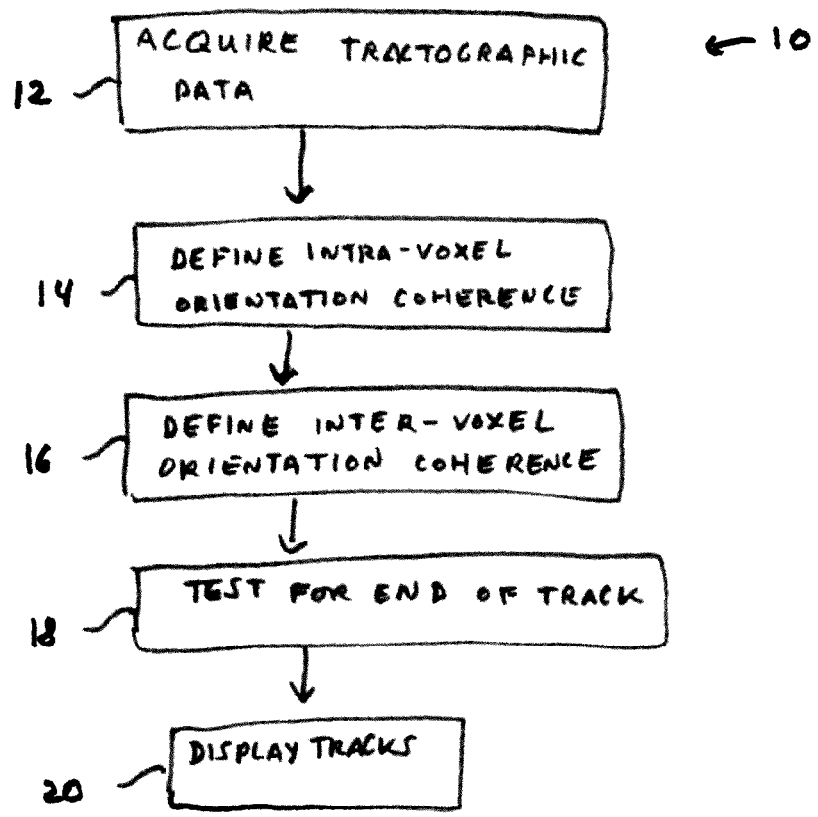
FIG. 2 is a flow-chart of a method for displaying diffusion data.
Figure 3:
FIG. 3 is a comparison of a conventional anatomic diagram of a portion of the brain with diffusion data associated with the same portion.

FIG. 2 illustrates a process 10 that is particularly useful for facilitating the interpretation of diffusion data. FIG. 3 illustrates the difference between a conventional anatomic map of a portion of the brain and a corresponding map of the same portion in which tracks are shown.

The process 10 begins with the acquisition of high-resolution MRI data (step 12). As used herein, high-resolution data refers to data that contains more information than is provided in conventional diffusion tensor MRI. A variety of ways are known for acquiring such data. These include diffusion spectrum imaging ("DSI") and q-ball MRI. Details of these methods are set forth in U.S. Pat. No. 6,614,226 and U.S. Patent Publication 2002/0042569, the contents of which are herein incorporated by reference.

The result of the foregoing data acquisition step is an association between each voxel and an orientation density function. The independent variable associated with the orientation density function is thus a spatial angle in a three-dimensional space. For each value of that spatial angle, the orientation density function provides a measure of the likelihood that a track passing through its associated voxel proceeds in a direction indicated by that spatial angle. Because MRI determines these values in large part on the basis of the diffusion of water through nerve fiber tracks, the value of the orientation density function will be referred to as "diffusivity."

The orientation density function at a particular voxel has one or more local maxima. Each of these maxima indicates a possible direction of a track that passes through that voxel. In general, more than one track will pass through a voxel, with each track generating a pair of local maxima. As a practical matter, with finite angular resolution, if the local maxima generated by two tracks are too close together, it may prove impossible to resolve the two tracks.

As a contrast-enhancement measure, only the spatial angles associated with maxima of the orientation density function are of interest. The value of the orientation density function between maxima is irrelevant to the disclosed track building method. A vector leading from an origin in the direction of a particular local maximum will be referred to as an "orientation vector." In general, a particular voxel will have numerous orientation vectors associated with it.

The next step is to use the high-resolution diffusion data to define intra-voxel orientation coherence (step 14). In some cases, the high-resolution diffusion is pre-processed to enhance the ability to identify those directions in which diffusivity has a local maximum. One way to do so is to pass the high-resolution diffusion data through a high-pass filter.

Local diffusivity maxima at each voxel are then identified. This can be carried out by, for example, projecting diffusivity onto a polyhedral surface, such as an n-fold geodesated icosahedron, and finding discrete local maxima. When an icosahedron is used, the available orientations correspond to the vertices of the icosahedron.

Regardless of the method used, for each voxel, the result is a finite set of orientation vectors, with the direction of each vector being indicative of a direction of local diffusivity maximum at that voxel.

In the case of DSI, angular resolution is given by the product R/r where R is the diffusion field of view and r is the diffusion resolution. In addition, $R/r = \Delta Q/Q_{max}$ where $Q_{max}$ is the maximum experimental q-value and $\Delta Q$ the q-step. Achieved resolution is the minimum of the experimental resolution and the diffusion angular contrast, which is approximately the product of a diffusion anisotropy and an experimental b-value.

The next step is to define inter-voxel orientation coherence (step 16). This is carried out in a sequence of steps that ultimately builds a track To build a track, one initializes the process at a first voxel and determines the direction, or orientation, associated with an orientation vector associated with that voxel. The direction of the orientation vector indicates a possible voxel on a track that includes the first voxel. As this procedure is repeated, a track emerges. At each voxel, the orientation of the track is changed to coincide with whichever diffusion orientation within that voxel is closest to the incoming orientation. The step size used in this procedure is typically half of the spatial extent of a voxel.

A nerve fiber track in the brain does not extend forever. At some point, it comes to an end. It is therefore desirable to determine when a track has reached its end. This is carried out by applying a test to decide whether to continue a track past a particular voxel or to terminate it at that voxel (step 18).

If one assumes a gradual change in the track's direction, one suitable test determines whether the proposed change in the direction of a track is greater than a threshold. If it is, then the track is terminated. A suitable threshold for use in such a test is a threshold of half a radian. In such a case, one defines, for each voxel, a cone having a half-radian cone angle. If the nerve fiber track appears to be proceeding outside the cone as it leaves that voxel, then the assumption is that the nerve fiber track has terminated.

More generally, this test can be based on diffusivity properties associated with voxels other than the next proposed voxel.

The preceding steps may be described as components of a probabilistic framework. As a first approximation, the p-value of a track, i.e., its likelihood of occurring at random, satisfies $$-\ln p \approx (\text{\# voxel boundaries crossed by the track}) \times (\text{acceptance rate})$$

where $$\text{acceptance rate} = 4\pi (\text{directions per voxel}) \times (\text{acceptance angle})^2$$

Figure 10:
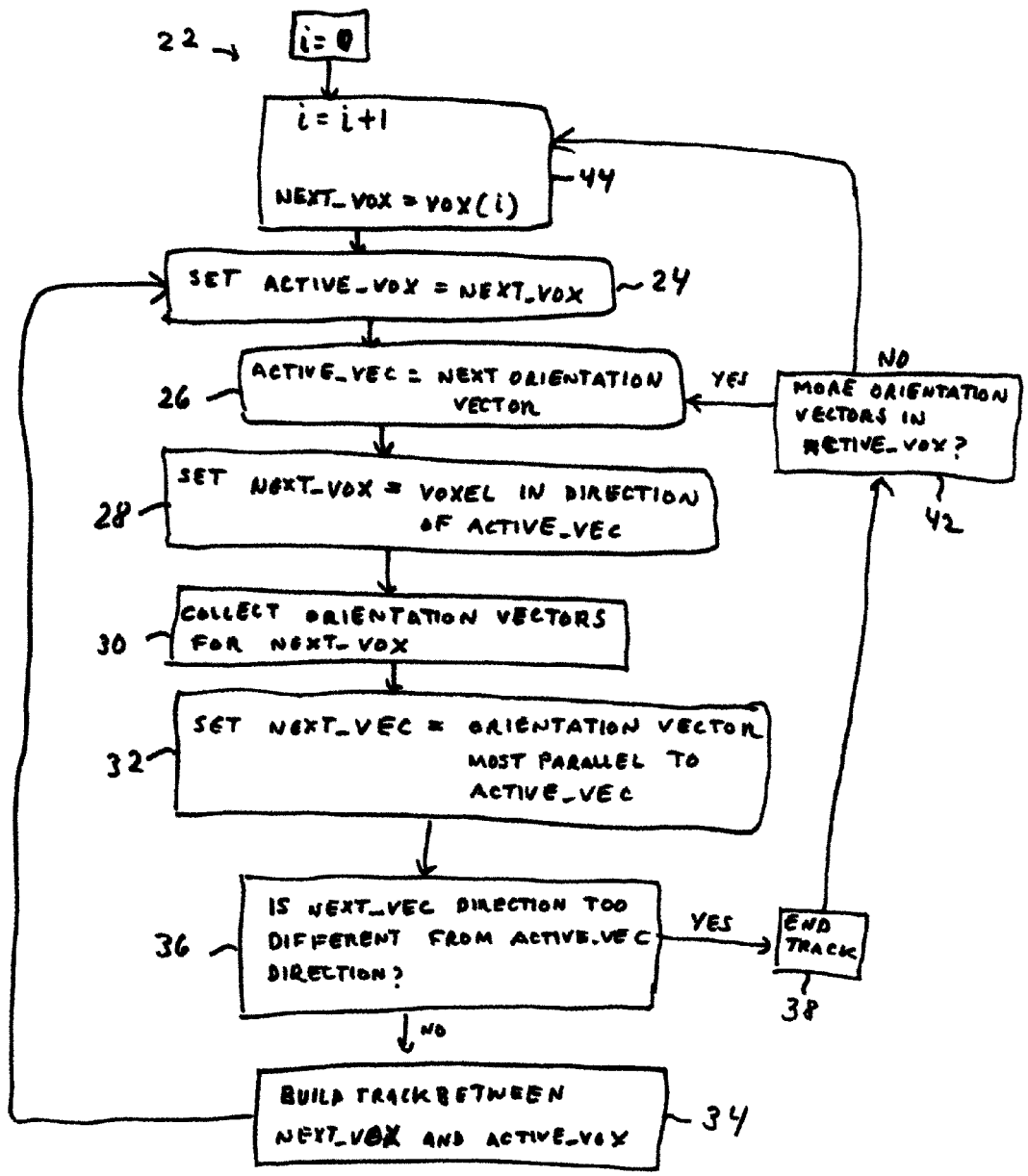
FIG. 10 is a flow-chart of a procedure for building tracks.

FIG. 10 shows, in more detail, a procedure 21 for building tracks on the basis of collected data. The procedure begins with some initializing steps (step 22), in which an index that identifies a voxel is set, and the "next voxel" is set to this first voxel (step 44)

In the next step, an active voxel is set to be the next voxel (step 24). This begins an inner loop in which all tracks that pass through the active voxel are built. Once all such tracks have been built from a particular active voxel, an outer loop repeats the procedure for a next active voxel.

As discussed above, the active voxel will have several orientation vectors. The procedure begins with selecting one of these orientation vectors and designating it as the "active vector" (step 26). This active orientation vector points to, and thereby defines a next voxel (step 28).

The next voxel likewise has a set of orientation vectors (step 30). The next step is to choose, from this pool of candidate next vectors, the vector that will be designated as the "next vector." A track section will ultimately be built along a path defined by the active vector and this next vector.

A variety of ways are available for selecting the next vector from among the candidate next vectors. One way, as discussed above, is to select that candidate next vector that is most nearly parallel to the active vector (step 32).

Once the next vector is designated, a track section is built along the path defined by the active vector and the next vector (step 34). Then, the active voxel is retired, and what was the next voxel adopts the mantle of the active voxel (step 24).

The whole procedure is then repeated to determine in what direction to build the next track section.

In some cases, the next vector and the active vector will point in very different directions (step 36). In this case, the track is assumed to have ended (step 38). If so, one proceeds to the starting voxel and begins the entire process again but using another orientation vector as the active vector (steps 42, 26). If there are no more active vectors for that active voxel (step 42), another voxel is designated as an active voxel (step 44).

The foregoing procedure is carried out for each voxel. Thus, for each voxel, and for each orientation vector associated with that voxel, one identifies a track that passes through that voxel in the direction of the orientation vector. The tracks are built by following orientation vectors outwards from the active voxel, and at each step, selecting that orientation vector that is closest to the preceding orientation vector in its direction. If two orientation vectors on the path are too different in direction, the track is ended.

The foregoing procedure is analogous to solving for streamlines in a vector field. A known procedure for carrying this out is to start at any point and to step to the next point in a direction given by the field vector at that point. Thus, for any point, there is only one direction in which one can move. In effect, streamlines do not cross.

This is no longer the case in the context of nerve fiber tracks because tracks, unlike streamlines, do cross. Thus, at any point in the field, i.e. at any voxel, there are in general several directions in which one can take the next step. These directions correspond to the orientation vectors that are obtained from the orientation density function. The method described herein provides a rational way to determine in which direction to take the next step in those cases in which many directions are possible.

The foregoing procedure thus provides a simple and deterministic way to extract a set of tracks from diffusion data by using an orientation density function. The actual source of the orientation density function does not matter. In many cases, the orientation density function is derived from DSI data. In such cases, the orientation density function is indicative of the diffusivity in various directions. However, the method disclosed herein does not rely on the source of the orientation density function.

When analyzing large amounts of data, it is often useful to examine subsets of that data in an effort to elucidate patterns or structures within the data. For example, one can often grasp the essence of a three-dimensional structure by examining transverse and longitudinal cross-sections of that structure. This is often referred to as "reducing" the data.

Once the tracks are defined, the next step is to display them in a meaningful way (step 20). This typically involves displaying only tracks having certain characteristics displayed. This process will be referred to generally as "reducing tractographic data."

For example, it is believed that longer tracks are of greater statistical significance than shorter tracks. Thus, in one display method, tracks of different lengths are displayed in different colors. Or, only tracks having particular ranges in length are displayed. In this case, the relevant characteristic is track length.

Figure 4:
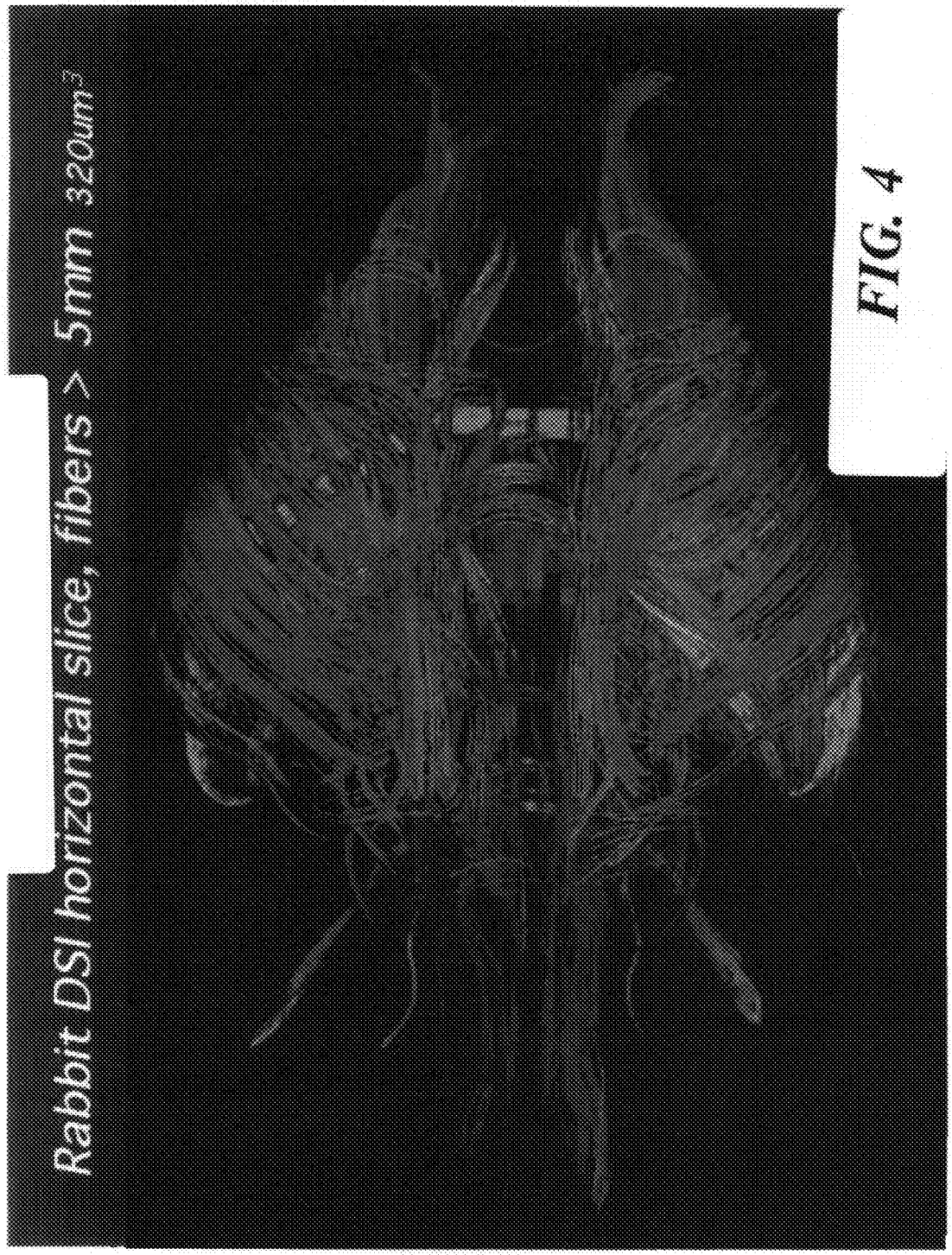
FIGS. 4 and 5 are images that show tracks having selected lengths.
Figure 5:
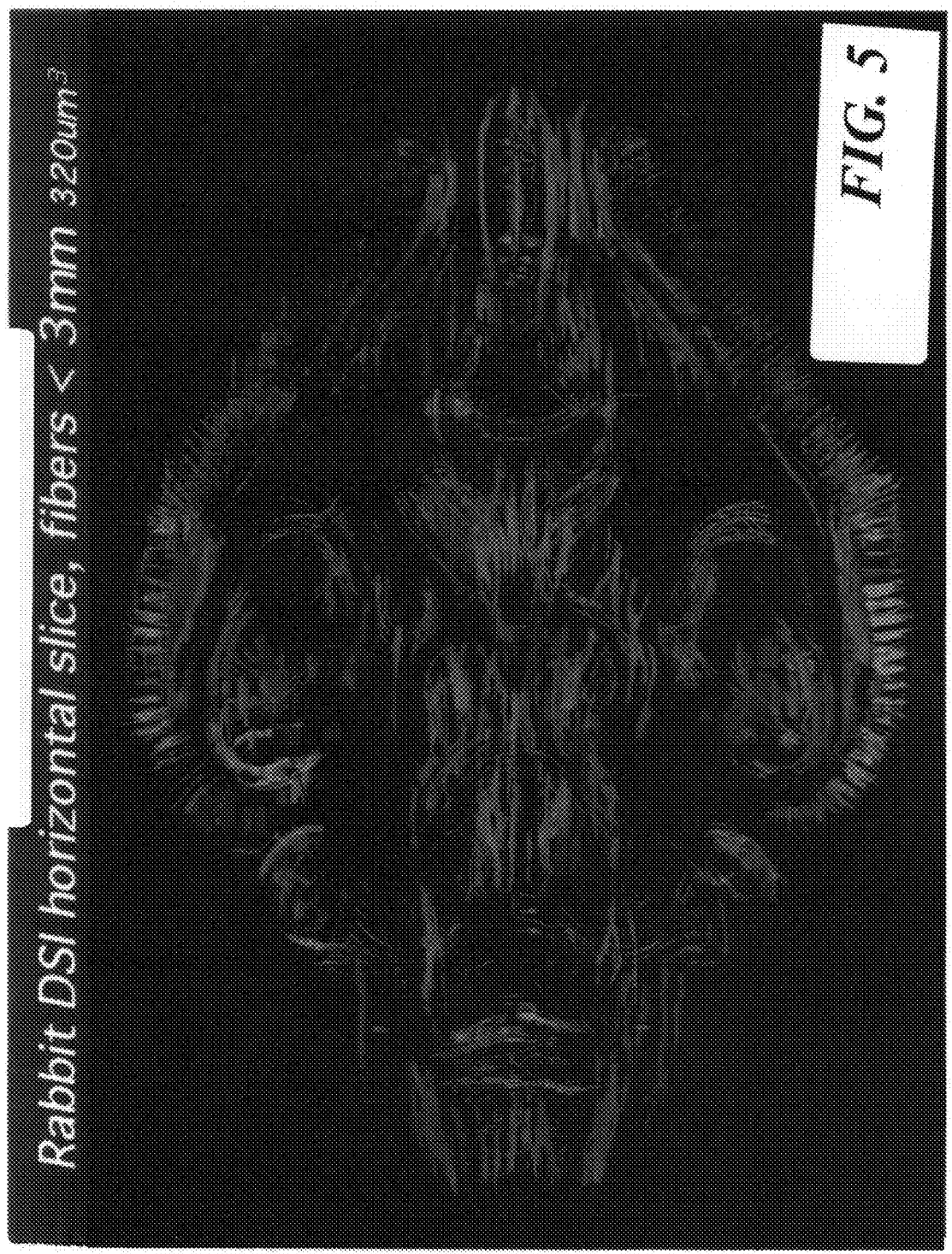

FIG. 4 shows one example of a display in which the tractographic data from a rabbit brain is reduced so that only those tracks having lengths in excess of 5 mm are displayed. FIG. 5 shows the same tractographic data, but reduced so that only those tracks having lengths less than 3 mm are shown.

Figure 6:
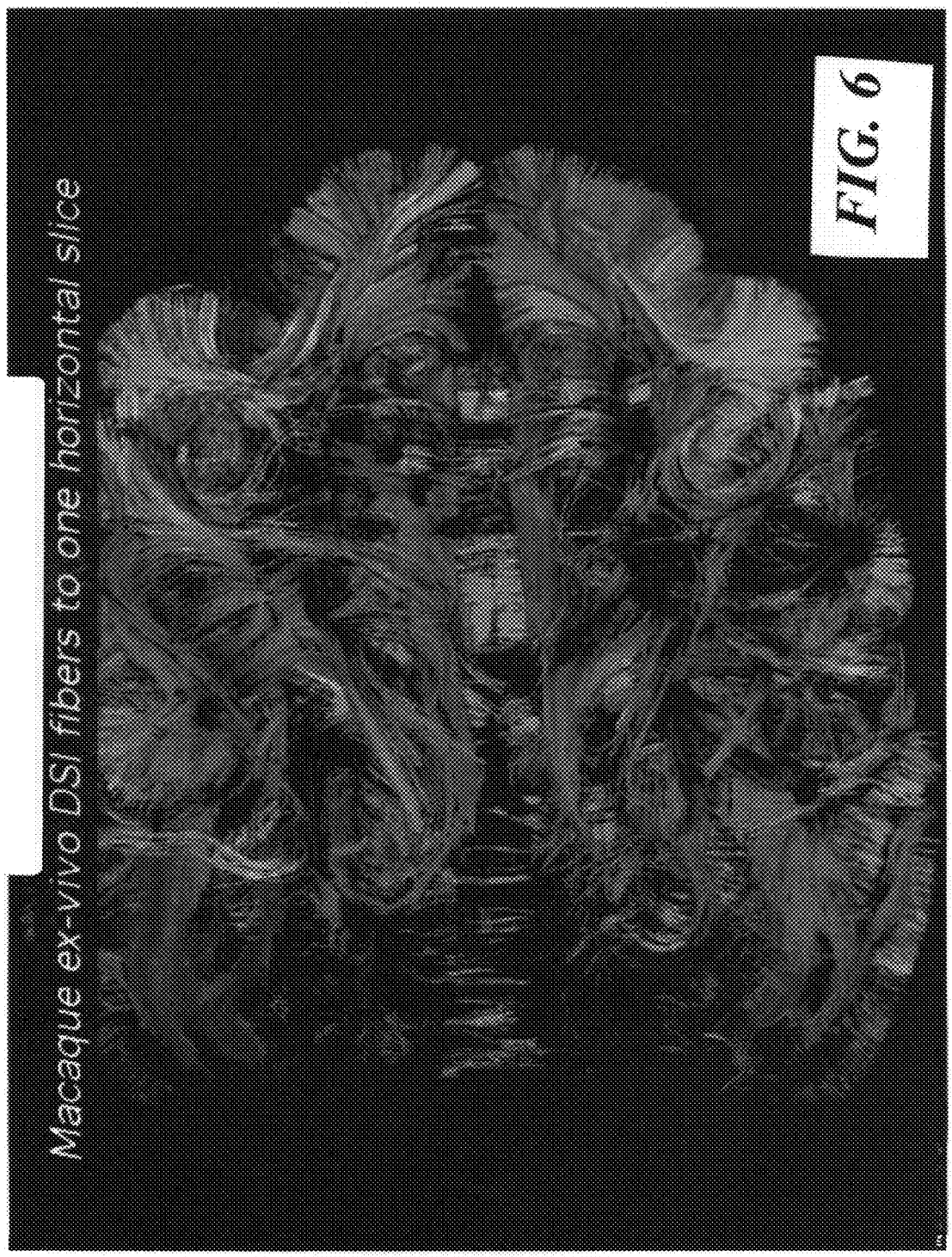
FIG. 6 is an image that shows only those tracks terminating at a particular slice.

In another example, the relevant characteristic is the endpoint of a track. Thus, one can choose to display only those tracks that intersect a particular volume or volumes of interest, or that intersect a particular surface or surfaces of interest. A particularly useful special case is that in which one displays all tracks that intersect a two-dimensional slice of the brain. For example, one could display all tracks that terminate in a particular plane. FIG. 6 shows tractographic data collected from a macaque brain reduced so that only those tracks terminating in the selected plane are shown.

This ability to carry out slice-selective display of tractographic data means that three-dimensional volume data can be fully interrogated on a slice-by-slice basis, thereby reducing the likelihood of missing any detected coherence.

Other exemplary characteristics used in reducing tractographic data are that the track terminate in a plane, surface, or volume, or that it intersect a plane, surface, or volume. Additional characteristics are those that depend on the geometry of the track rather than what the track crosses. Examples include the length of the track, already discussed above, as well as the track's curvature and its torsion.

The above-mentioned characteristics can be combined by logical operators. For example, one could choose to display all tracks having a particular length and that pass through a particular volume.

In those cases in which only that portion of the tractographic data associated with a slice is being displayed, it is useful to render MRI data, either for that slice or for other slices, as shaded planes within the three-dimensional image volume. This can provide an anatomic or other context for the displayed data.

In another display method, particularly useful for visualizing cortico-cortical tracks, one selects three points on the track and renders a circle. This results in a simplified display.

Tractographic data derived from high angular resolution MRI may be combined with data obtained using other contrast mechanisms, such as T1, T2, MT, or chemical shift. This can be done implicitly by, for example, using high resolution diffusion MRI with appropriate weighting, or by acquiring multiple high resolution studies with variable weightings and making explicit orientation-resolved images of the auxiliary parameter. In such a case, an auxiliary parameter may be explicitly associated with each track. The track can also be graphically coded to indicate this auxiliary parameter.

In displaying tractographic data, it is often useful to color-code the tracks. For example, one can assign a color to a track on the basis of the coordinates of the endpoints of the track, or on the basis of coordinates of two points at specified locations on the track. For example, one might correlate a color vector $\{r, g, b\}$ with a spatial vector $\{x, y, z\}$ where the spatial coordinates $\{x, y, z\}$ are the coordinates of a normalized vector X'-X, in which X' and X are the endpoints of the track, or two points near the center of the track. Such graphical renderings can be augmented by additional cues, such as color saturation, brightness, reflectivity, transparency, and thickness. These additional cues can be used to denote other parameters associated with each track.

In those cases in which tracks are generated by uniform initialization, initialization can occur anywhere on the track. Consequently, there is a natural over-representation of long tracks relative to short tracks, since long tracks, because they have more voxels, are more likely to be initialized.

One can correct this over-representation by reducing the representation of tracks in proportion to the reciprocal of their lengths. Alternatively, one can correct this over-representation by reducing the visual conspicuousness of longer tracks or by sub-sampling the tracks to be displayed. Oversampling can be avoided by displaying tracks in sets likely to initialize each track only once. Such track sets include many two-dimensional planes, as well as gray matter boundary surfaces.

The method has been described in the context of mapping nerve fiber tracks in the brain. However, the method is in fact a radically new approach to imaging neuro-anatomy. As such, it can be used to enhance the display of the neuro-anatomy of any structure or in connection with any application. For example, one can use the methods described herein to define important nerve fiber structures in the surgical field when planning surgery, or to assess nerve fiber invasion and displacement in the evaluation of tumors. The method can also be used in connection with diagnosis or treatment of nerve fiber disease, such as MS, (multiple sclerosis) trauma, or primary or secondary nerve fiber degeneration.

Figure 7:
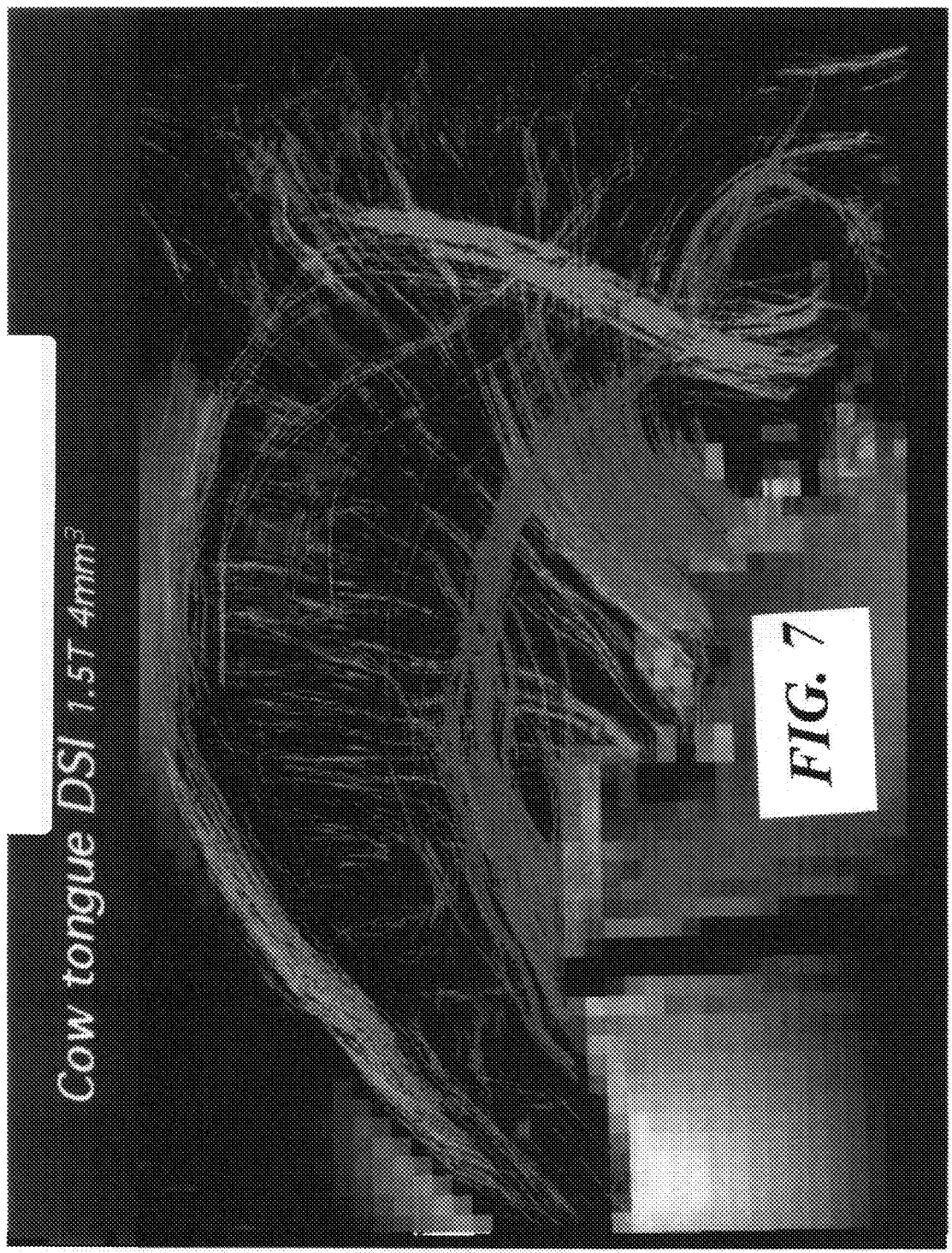
FIG. 7 is an image that shows tracks in a cow's tongue.
Figure 8:
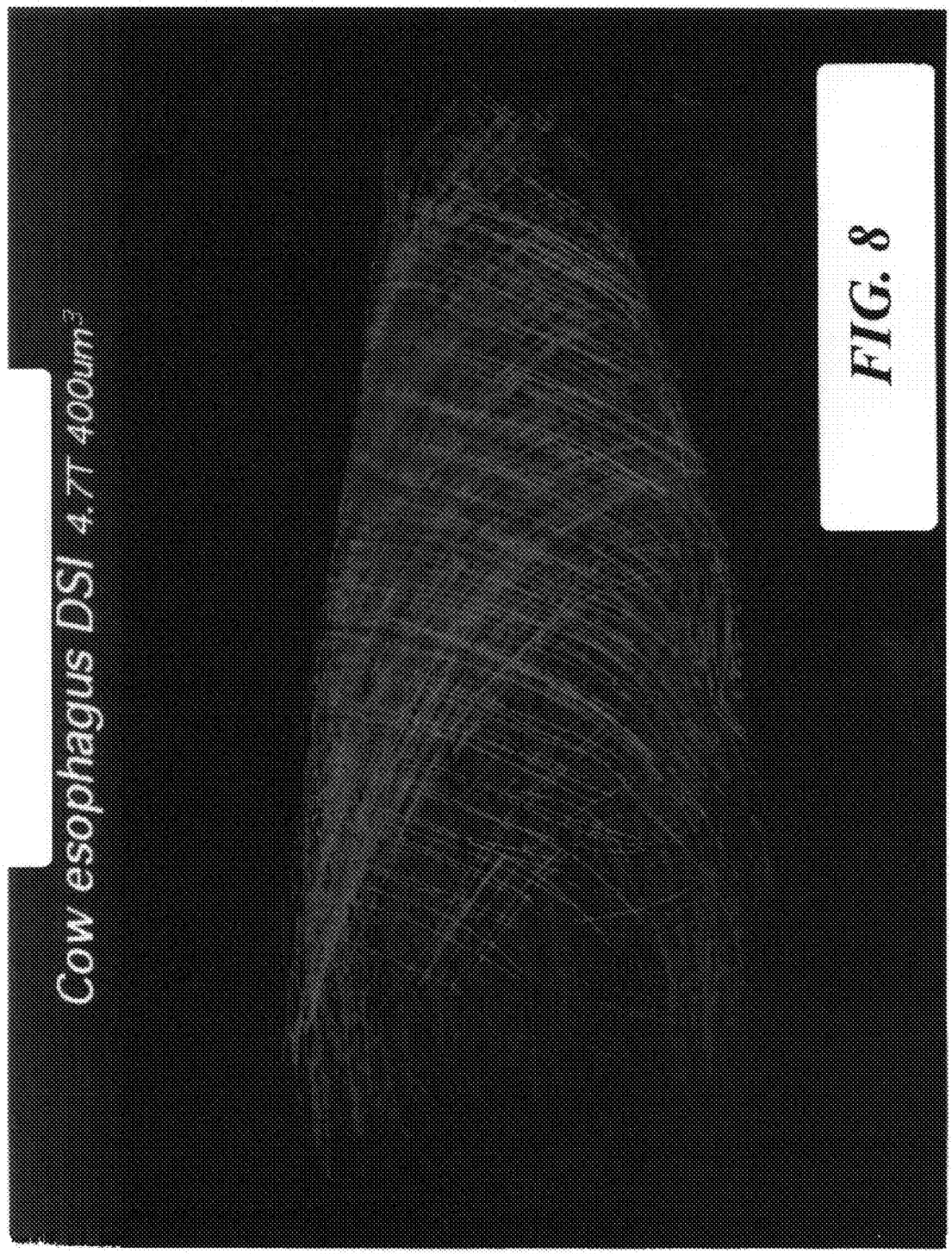
FIG. 8 is an image that shows tracks in a cow's esophagus.
Figure 9:
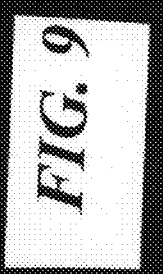
FIG. 9 is an image that shows tracks in a cow's heart.

The method can also be used to visualize tractographic data from a variety of other anatomic structures. For example, FIGS. 7-9 show tractographic data from a cow's tongue, esophagus, and heart respectively.

Additional applications of the methods described herein arise in the observation of neural development, including myelination, cortical dysplasia, and neuro-vascular injury. Applications also exist in neuropsychiatry, for example in the identification of track-specific anomalies in dyslexia, and schizophrenia, particularly in the analysis of frontal nerve fiber.

The methods described herein also find application in the study of structural connectivity, and correlation with fMRI, and in MEG (myoencephalography), particularly in studies of functional connectivity.

In addition, the methods described herein find application in the study of the cortex, for example in the study of gray matter parcellation, including cortical parcellation, by clustering of connectivities.

Having described the invention, and a preferred embodiment thereof, what is claimed as new, and secured by Letters Patent is:

1. A non-transatory computer-readable medium having encoded thereon software for causing display of diffusion data, the software including instructions for:
    obtaining orientation density functions associated with the diffusion data;
    obtaining, from an orientation density function associated with a first voxel, a first orientation vector, the first voxel lying on at least one track;
    identifying a second voxel on the basis of the first orientation vector;
    selecting, from a set of orientation vectors associated with the second voxel, a second orientation vector; and
    determining, on the basis of a relationship between the first and second orientation vector, whether a section of track is to be built along a path defined by the first and second orientation vectors.

2. A non-transatory computer-readable medium of claim 1, wherein the software further comprises instructions for ending the track in response to determining that the relationship between the first and second orientation vector is inconsistent with continuing the track.

3. A non-transatory computer-readable medium of claim 1, wherein the software further comprises instructions for defining a track section along the path defined by the first and second orientation vectors.

4. A non-transatory computer-readable medium of claim 1, wherein the software further comprises instructions for selecting the relationship to include determining a difference in the directions of the first and second orientation vectors, and defining a threshold difference in direction, such that if the difference is in excess of the threshold, the track is terminated.

5. A non-transatory computer-readable medium of claim 1, wherein the instructions for selecting the second orientation vector comprise instructions for selecting, from the set of orientation vectors associated with the second voxel, that vector that is closest to being parallel to the first orientation vector.

6. A non-transatory computer-readable medium having encoded thereon software for causing the display of diffusion data, the software including instructions for:
    defining intra-voxel coherence of the diffusion data;
    defining inter-voxel coherence of the diffusion data;
    on the basis of the inter-voxel coherence and the intra-voxel coherence, defining a multiplicity of tracks; and
    displaying only those tracks that have a selected characteristic.

7. A non-transatory computer-readable medium of claim 6, wherein the software further comprises instruction for selecting the characteristic to be related to track length.

8. A non-transatory computer-readable medium of claim 6, wherein the instructions for displaying only those tracks that have a selected characteristic comprise instructions for displaying only those tracks that contact a selected volume.

9. A non-transatory computer-readable medium of claim 6, wherein the instructions for displaying only those tracks that have a selected characteristic comprise instructions for displaying only those tracks that cross a selected slice.

10. A non-transatory computer-readable medium of claim 6, wherein the instructions for displaying only those tracks that have a selected characteristic comprise instructions for displaying only those tracks that terminate at a selected slice.

11. A non-transatory computer-readable medium of claim 6, wherein the instructions for displaying only those tracks that have a selected characteristic comprise instructions for assigning a display property to a track, the display property corresponding to a characteristic of the track.

12. A non-transatory computer-readable medium of claim 11, wherein the software further comprises instructions for selecting the display property to be color.

13. A non-transatory computer-readable medium of claim 11, wherein the software further comprises instructions for selecting the display property to depend on an endpoint of the track.

14. A non-transatory computer-readable medium of claim 11, further comprising selecting the display property to depend on track length.

15. A method for displaying diffusion data, the method comprising:
    obtaining orientation density functions associated with the diffusion data;
    obtaining, from an orientation density function associated with a first voxel, a first orientation vector; the first voxel lying on at least one track;
    identifying a second voxel on the basis of the first orientation vector;
    selecting, from a set of orientation vectors associated with the second voxel, a second orientation vector; and determining, on the basis of a relationship between the first and second orientation vector, whether a section of track is to be built along the path defined by the first and second orientation vectors.

16. The method of claim 15, further comprising ending the track if the relationship between the first and second orientation vector is inconsistent with continuing the track.

17. The method of claim 15, further comprising defining a track section along the path defined by the first and second orientation vectors.

18. The method of claim 15, further comprising selecting the relationship to include determining a difference in the directions of the first and second orientation vectors, and defining a threshold difference in direction, such that if the difference is in excess of the threshold, the track is terminated.

19. The method of claim 15, wherein selecting the second orientation vector comprises selecting, from the set of orientation vectors associated with the second voxel, that vector that is closest to being parallel to the first orientation vector.

20. A method for displaying diffusion data, the method comprising:
defining intra-voxel coherence of the diffusion data;
defining inter-voxel coherence of the diffusion data;
on the basis of the inter-voxel coherence and the intra-voxel coherence, defining a multiplicity of tracks; and
displaying only those tracks that have a selected characteristic.

21. The method of claim 20, further comprising selecting the characteristic to be related to track length.

22. The method of claim 20, wherein displaying only those tracks that have a selected characteristic comprises displaying only those tracks that contact a selected volume.

23. The method of claim 20, wherein displaying only those tracks that have a selected characteristic comprises displaying only those tracks that cross a selected slice.

24. The method of claim 20, wherein displaying only those tracks that have a selected characteristic comprises displaying only those tracks that terminate at a selected slice.

25. The method of claim 20, wherein displaying only those tracks that have a selected characteristic comprises assigning a display property to a track, the display property corresponding to a characteristic of the track.

26. The method of claim 25, further comprising selecting the display property to be color.

27. The method of claim 25, further comprising selecting the display property to depend on an endpoint of the track.

28. The method of claim 25, further comprising selecting the display property to depend on track length.

29. A magnetic resonance imaging system comprising
a magnetic field source;
a detection subsystem for detecting electromagnetic radiation generated in response to operating the magnetic field source;
a controller for controlling operation of the magnetic field source and the detection subsystem;
a processing subsystem for generating diffusion data on the basis of data provided by the detection subsystem, the processing subsystem being configured to
obtain orientation density functions associated with the diffusion data;
obtain, from an orientation density function associated with a first voxel, a first orientation vector; the first voxel lying on at least one track;
identify a second voxel on the basis of the first orientation vector;
select, from a set of orientation vectors associated with the second voxel, a second orientation vector; and
determine, on the basis of a relationship between the first and second orientation vector, whether a section of track is to be built along the path defined by the first and second orientation vectors.

30. The system of claim 29, wherein the processing subsystem is further configured to end the track if the relationship between the first and second orientation vector is inconsistent with continuing the track.

31. The system of claim 29, wherein the processing subsystem is further configured to define a track section along the path defined by the first and second orientation vectors.

32. The system of claim 29, wherein the processing subsystem is further configured
to select the relationship to include a difference in the directions of the first and second orientation vectors, and
to define a threshold difference in direction, such that if the difference is in excess of the threshold, the track is terminated.

33. The system of claim 29, wherein the processing subsystem is configured to select the second orientation vector at least in part by selecting, from the set of orientation vectors associated with the second voxel, that vector that is closest to being parallel to the first orientation vector.

34. A magnetic resonance imaging system comprising:
a magnetic field source;
a detection subsystem for detecting electromagnetic radiation generated in response to operating the magnetic field source;
a controller for controlling operation of the magnetic field source and the detection subsystem;
a processing subsystem for generating diffusion data on the basis of data provided by the detection subsystem, the processing subsystem being configured to
define intra-voxel coherence of the diffusion data;
define inter-voxel coherence of the diffusion data;
on the basis of the inter-voxel coherence and the intra-voxel coherence, define a multiplicity of tracks; and
display only those tracks that have a selected characteristic.

35. The system of claim 34, wherein the processing subsystem is further configured to select the characteristic to be related to track length.

36. The system of claim 34, wherein the processing subsystem is configured to display only those tracks that contact a selected volume.

37. The system of claim 34, wherein the processing subsystem is configured to display only those tracks that cross a selected slice.

38. The system of claim 34, wherein the processing subsystem is configured to display only those tracks that terminate at a selected slice.

39. The system of claim 34, wherein the processing subsystem is configured to display only those tracks that have a display property assigned to a track, the display property corresponding to a characteristic of the track.

40. The system of claim 39, wherein the processing subsystem is configured to select the display property to be color.

41. The system of claim 39, wherein the processing subsystem is configured to select the display property to depend on an endpoint of the track.

42. The system of claim 39, wherein the processing subsystem is configured to select the display property to depend on track length.

* * * * *